United States Patent
McEwan

[11] Patent Number: 6,031,421
[45] Date of Patent: Feb. 29, 2000

[54] CONTROLLED GAIN AMPLIFIER WITH VARIABLE CONTROL EXPONENT

[76] Inventor: Thomas E. McEwan, 1734 Cairo St., Livermore, Calif. 94550

[21] Appl. No.: 09/120,991

[22] Filed: Jul. 22, 1998

[51] Int. Cl.[7] ......................................... H03F 3/38
[52] U.S. Cl. ................................. 330/10; 330/251
[58] Field of Search .......................... 330/90, 137, 251, 330/51, 207 A; 327/124, 172, 173, 174, 175, 176

[56] References Cited

U.S. PATENT DOCUMENTS

| | | | |
|---|---|---|---|
| 3,963,992 | 6/1976 | Hekimian et al. | 330/127 |
| 4,005,283 | 1/1977 | Rhodes | 235/194 |
| 4,066,976 | 1/1978 | Dickopp et al. | 330/86 |
| 4,239,992 | 12/1980 | Perkins | 307/265 |
| 4,396,890 | 8/1983 | Kato et al. | 330/86 |
| 4,422,049 | 12/1983 | Akagiri et al. | 330/134 |
| 4,429,285 | 1/1984 | Bradshaw | 330/279 |
| 4,441,080 | 4/1984 | Saari | 330/86 |
| 4,452,085 | 6/1984 | Pelc et al. | 73/631 |
| 4,638,176 | 1/1987 | Martinelli | 307/64 |
| 4,779,053 | 10/1988 | Hitt | 328/144 |
| 5,113,149 | 5/1992 | Terada et al. | 330/254 |
| 5,220,219 | 6/1993 | Barber | 307/493 |
| 5,418,494 | 5/1995 | Betti et al. | 330/254 |
| 5,485,155 | 1/1996 | Hibino | 342/70 |
| 5,530,404 | 6/1996 | Debroux | 330/278 |
| 5,572,166 | 11/1996 | Gilbert | 330/254 |
| 5,612,862 | 3/1997 | Marusik et al. | 363/93 |

*Primary Examiner*—Benny Lee
*Assistant Examiner*—Henry Choe
*Attorney, Agent, or Firm*—Mark A. Haynes; Haynes & Beffel LLP

[57] ABSTRACT

A controlled-gain amplifier has a gain control port responsive to a control voltage Vc, and produces a gain proportional to Vc raised to a fixed or continuously variable power X, such that gain=$K(Vc)^X$, where K is a constant. Precise gain control is achieved through the use of pulse width modulation (PWM) control of cascaded amplifier stages. A PWM regulator linearly controls the gain of each amplifier stage, and multiple stages are cascaded for $(Vc)^N$ gain control, where N is an integer. One or more amplifier stages may contain a variable low pass filter that allows continuous control of the control exponent to produce non-integer exponents. The circuit can be used as a Sensitivity-Time-Control (STC) circuit in sampling-type radar systems, or in ultrasonic rangefinders, where the gain of the receiver needs to increase exponentially with increasing range.

19 Claims, 4 Drawing Sheets

6,031,421

CONTROLLED GAIN AMPLIFIER WITH VARIABLE CONTROL EXPONENT

BACKGROUND OF THE INVENTION

1. Field of the Invention

The present invention relates to amplifiers, and more particularly to controlled-gain audio or video bandwidth amplifiers with a precise exponential relation between gain and control voltage.

2. Description of Related Art

Voltage-controlled variable gain amplifiers are used in Automatic Gain Control (AGC) circuits and Sensitivity-Time-Control (STC) circuits in sampling-type radar rangefinders and in ultrasonic rangefinders. AGC circuits do not require high gain-control accuracy since amplifier gain is regulated by a feedback loop responsive to signal amplitude, where gain-control inaccuracies are substantially reduced by the control loop gain. Consequently, most AGC circuits are able to use low-accuracy variable transconductance elements such as vacuum tubes, PN junctions, or FETs as the voltage-controlled gain element.

STC circuits increase receiver gain as a mathematical function of the time after a pulse is transmitted (or equivalently, the range to the target). Usually, the gain relation varies with $R^2$, where R is the radar or ultrasonic range to a target. This is a natural relation due to wave expansion as a function of range. However, if a target is very large, such as a pool of water at the bottom of a large tank, the STC gain relation varies with $R^1$. Another situation occurs when propagating through a lossy medium such as soil for ground penetrating radar (GPR) or through air for ultrasonic rangefinders. In this case the STC gain relation might vary with $R_x$, where x is a non-integer exponent generally >2.0 that is materials dependent. Thus there is a need for user-adjustable continuously-variable gain relation STC exponent control.

STC circuits, like AGC circuits, provide a large gain-control range in most receiver applications, perhaps 60 dB or greater. In AGC circuits, the output is regulated, eliminating the possibility of signal saturation. STC circuits, however, must have an accurate control relation since a large amount of gain is controlled by a range-dependent voltage on an open-loop basis. When variable transconductance elements are used in STC circuits, a high reliance must be placed on matched elements, circuit symmetries, and other precision analog techniques to achieve high accuracy. Precision analog elements are expensive and there is a limited selection of suitable devices.

SUMMARY OF THE INVENTION

It is an object of the present invention to provide a precision wide-range controlled-gain amplifier.

Another object of the present invention is to provide a low cost STC circuit that is highly repeatable in manufacture.

A further object of the present invention is to provide a voltage-controlled gain circuit where the gain is proportional to a control voltage raised to an exponent and the exponent may be an integer or a non-integer and may be continuously adjustable.

The present invention is a controlled-gain amplifier which employs a pulse width modulation (PWM) regulator in a DC control loop responsive to a gain-control voltage. The PWM regulator operates at a clock frequency that is well above the signal frequency to avoid aliasing, and generates a variable duty-cycle clock signal (waveform) that controls one or more switched amplifier-lowpass filter stages cascaded in the signal path. Each of these stages has a gain proportional to duty-cycle, so the first stage has a linear gain relationship, the second stage has a squared relationship, and so on. Thus the first stage output is used for $R^1$ STC correction, and the second stage output provides $R^2$ correction, where R is the range to a target.

The lowpass filter in the first stage may have a continuously variable cutoff. If the cutoff is set to the clock frequency or above, the first PWM switch is effectively placed in series with the second stage switch, without any pulse-width averaging. Thus, the first stage loses its variable gain effect and the second stage output reverts from $R^2$ to $R^1$ control. As the lowpass cutoff is reduced, the first stage smoothly increases its variable gain effect, so the second stage exhibits $R_x$ control, where 1.0<x<2.0 depending on the lowpass cutoff. The lowpass cutoff is controlled with a simple potentiometer. Alternatively to changing the lowpass filter cutoff, the same effect may be produced by changing the gain of the fixed gain amplifier in the first stage, e.g., by changing the value of a feedback resistor.

The present invention can be used as an STC circuit in a wide variety of low cost high-resolution sampling-type radar and ultrasonic rangefinder applications, such as tank level measurement, robotics, automotive safety, and general industrial and commercial ranging and object detection applications.

DETAILED DESCRIPTION OF THE INVENTION

A detailed description of the present invention is provided below with reference to the figures. While illustrative parameters are given, other embodiments can be constructed with other components and values.

A controlled-gain amplifier of the invention has a gain responsive to a control voltage Vc applied to a gain-control port. The amplifier produces a gain proportional to Vc raised to a fixed or continuously adjustable power or control exponent X, such that gain=$K(Vc)^X$, where K is a constant. The control exponent X can have integer (N) and non-integer values. Precise gain control is achieved through the use of pulse width modulation (PWM) control of cascaded amplifier stages. A PWM regulator linearly controls the gain of each amplifier stage, and multiple stages are cascaded for $(Vc)^N$ gain control, where N is an integer. One or more amplifier stages may contain a variable lowpass filter that allows continuous control of the control exponent, to produce $(Vc)^X$ gain control, where X is a non-integer. Alternatively, adjustment of the gain, e.g., by a feedback potentiometer, of the fixed gain amplifier in one or more of the stages can be used to produce $(Vc)^x$ gain control. The circuit can be used as a Sensitivity-Time-Control (STC) circuit in sampling-type radar systems, or in ultrasonic rangefinders, where the gain of the receiver needs to increase with increasing range raised to some exponent.

Figure 1:
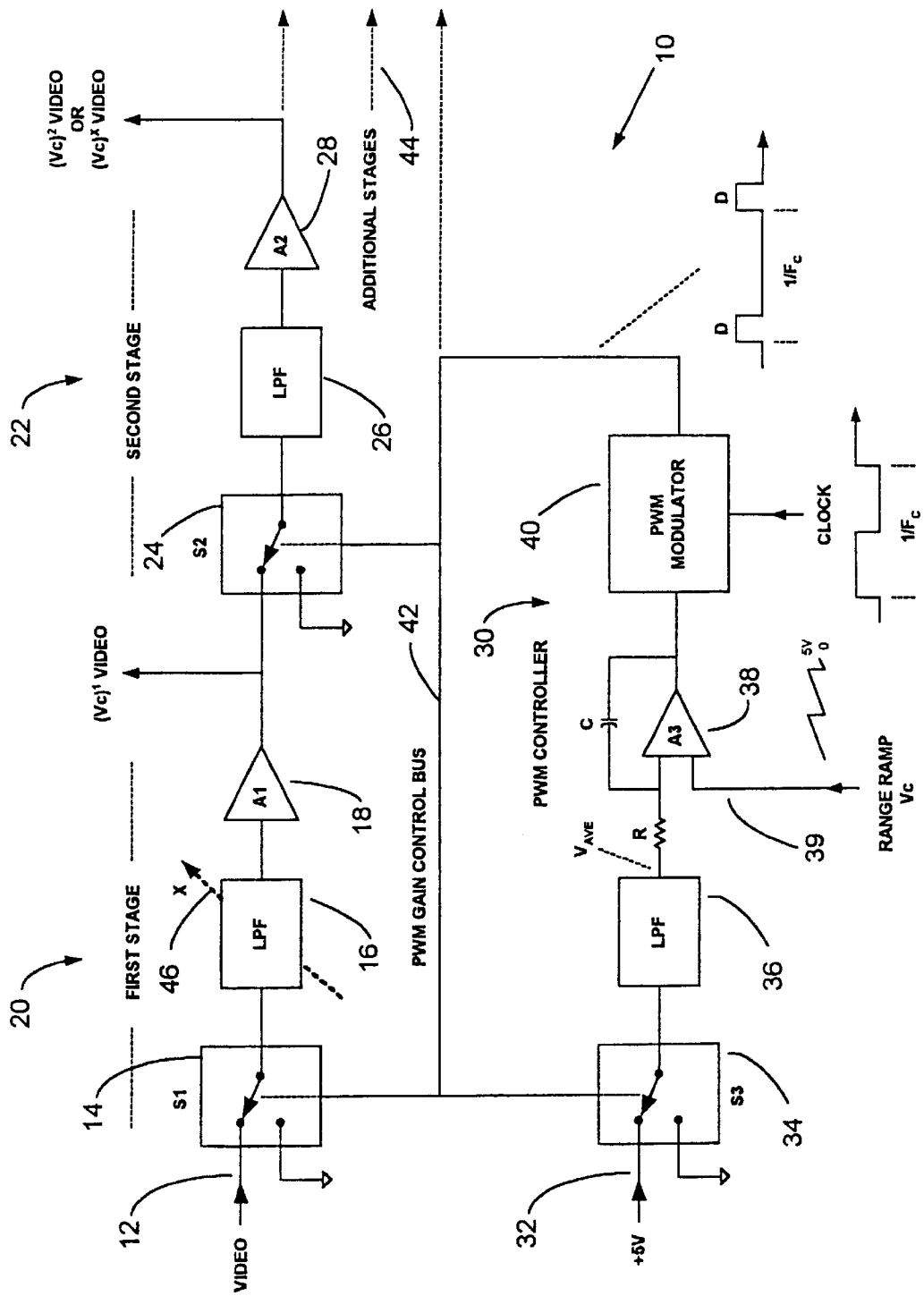
FIG. 1 is a block diagram of the present invention with cascaded controlled-gain stages and a PWM controller.

FIG. 1 is a block diagram of the controlled-gain amplifier 10 of the present invention. A video signal (VIDEO) is applied to the input 12 of the amplifier 10. In most applications the video signal is comprised of substantially sinusoidal bursts with a sinewave or carrier frequency in the range of 1 kHz–100 kHz. The bursts represent echoes from an ultrasonic rangefinder or a sampling type short-range radar having an equivalent time output.

The video input 12 is connected to one input position of switch (S1) 14. The other input position of S1 is connected to ground. S1 is toggled between its two positions at a clock frequency Fc and a duty cycle D. Fc is set to be substantially above the video frequencies, such as 200 kHz, to prevent video signal aliasing. The output of S1 carries a chopped version of the video input. A lowpass filter (LPF) 16 averages the chopped signal from S1 into an attenuated version of the video input. The attenuation factor depends directly on the duty cycle D, which can vary from 0 to 1. A fixed gain amplifier (A1) 18, with a typical gain of 30 dB follows the lowpass filter 16. Depending on the duty cycle D, the gain of this first stage 20, comprised of S1, the LPF 16 and A1, can vary from −10 dB to +30 dB.

A second stage 22, comprised of switch (S2) 24, lowpass filter (LPF) 26 and fixed gain amplifier (A2) 28, is cascaded with the first stage 20. The output of A1 is input into one input position of S2 whose other input is connected to ground. The output of S2 is input into LPF 26 whose output is input into A2. The second stage operates similarly to the first stage and also produces gain from −10 dB to +30 dB. S1 and S2 are both toggled together so the gain of the cascade ranges from −20 dB to +60 dB. The first and second stage gains are each directly related to D, and the cascaded gain of the two stages is related to $D^2$. Additional stages would behave similarly and the cascaded gain of N stages is related to $D^N$, and since D depends on the control voltage Vc, the cascaded gain is proportional to $(Vc)^N$.

A pulse width modulation (PWM) controller or regulator 30 has a third switch (S3) 34 operated by the same clock signal as S1 and S2. The two inputs of S3 are connected to a +5 V input 32 and to ground (0 V). S3 switches either +5 V or 0 V into a lowpass filter (LPF) 36 such that the average voltage $V_{ave}$ from LPF 36 is directly proportional to D and the +5 V input 32. A PWM control (differential) amplifier (A3) 38 compares $V_{ave}$ to a control voltage Vc (e.g. a 0 to +5 V ramp) and applies an amplified error signal to a PWM modulator 40. The output of LPF 36 is input to one input of A3 through a resistor R, and Vc is applied to a second input of A3 from gain control port 39. The output of A3 is connected to the first input through a capacitor C. The PWM modulator 40 converts a squarewave (50% duty cycle) clock input signal of frequency Fc (CLOCK) into a variable duty cycle clock with a duty cycle D (PWM CLOCK) in response to the control amplifier (A3) 38 output. The PWM modulator 40 output drives the PWM GAIN CONTROL bus 42 which is connected to and causes all the switches S1, S2, S3 to operate with exactly the same duty cycle. The high gain of the control amplifier A3 forces S3 to have a precise duty cycle in relation to the control input Vc, and consequently S1 and S2 have the same precise duty cycle. Thus the first and second stage gains are precisely proportional to the control voltage, and the cascaded gain of multiple stages is proportional to a power of the control voltage.

Essentially, PWM controller 30 operates by comparing $V_{ave}$ to Vc. As Vc changes, e.g. goes from 0 to +5 V when Vc is a range ramp, the duty cycle D of the output clock signal of PWM modulator 40 is changed so that the output of S3 and LPF 36 ($V_{ave}$) goes from 0 to +5 V to match Vc. Controller 30 needs to keep the two inputs ($V_{ave}$ and Vc) to A3 equal. When the duty cycle D is correct, $V_{ave}$ matches Vc, so the inputs are equal, the output of A3 is quiescent and PWM modulator 40 does not change D. However, when the signals are unequal, the output of A3 causes PWM modulator 40 to change D so that S3 (and LPF 36) change $V_{ave}$ to again match Vc.

Figure 3:
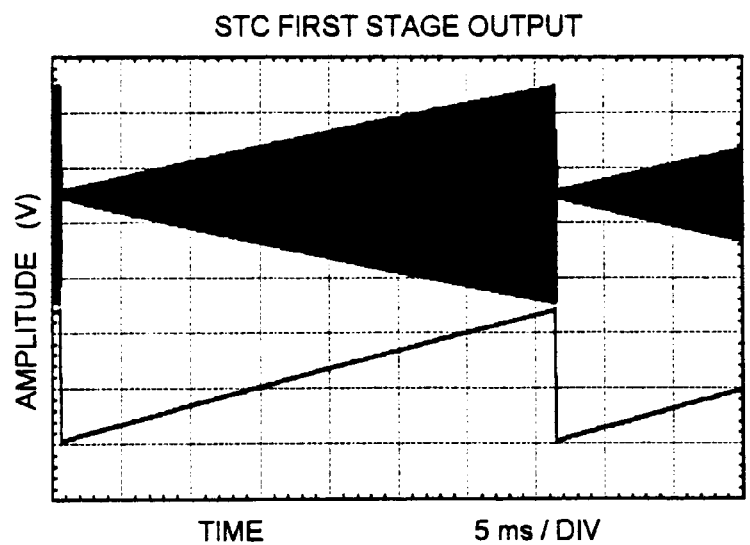
FIG. 3 shows the linear relation between a ramped control voltage (lower trace) and the output of the first amplifier stage (upper trace).

FIG. 3 shows a ramped control voltage $V_c$ (lower trace) and the linearly related $(V_c^1)$ video output (upper trace) from the first stage. To obtain the upper trace, a continuous 12 KHz sinusoid was applied to the video input. Therefore, the upper plot is a direct indication of the first stage gain. The control ramp extends from 0 to +5 V, and the DC reference voltage applied to S3 is +5 V. When the control voltage matches the reference voltage, the duty cycle D equals 1.000. Other reference voltages can be used, or the reference may vary with $V_c$ or some other parameter. In rangefinder applications, the control ramp represents range or controls a range gate; thus it is termed a range ramp.

Figure 4:
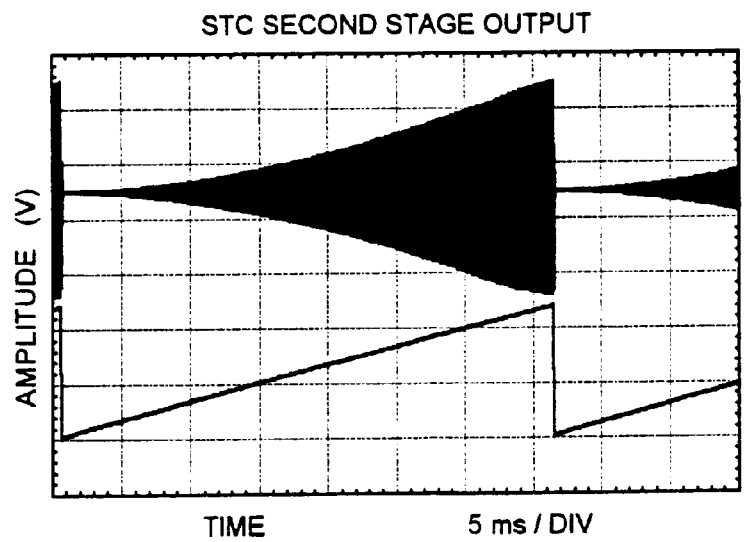
FIG. 4 shows the square-law relation between a ramped control voltage (lower trace) and the output of the second amplifier stage (upper trace).

FIG. 4 shows a ramped control voltage $V_c$ (lower trace) and the square-law related $(V_c^2)$ video output (upper trace) from the second stage.

In this invention, a precise duty cycle D from a PWM modulator controls the stage gain, and not variable analog transconductance elements. Further, a precise square relation, $V_c^2$, is obtained by simple cascading of the stages. Higher order exponents are easily obtained by cascading additional stages, as indicated in FIG. 1, by arrow 44. When the amplifier is designed for integer exponent control, the cascaded gain of N stages is proportional to $(Vc)^N$.

Variable exponent control is implemented by varying the impact of the LPF 16 in the first stage 20 (or the LPF in additional stages if desired). To understand this operation, it should be recognized that the output of the second stage 22 is related to $(Vc)^2$ when the first stage 20 is functioning as described above, i.e., producing a gain related to Vc. However, if the LPF 16 in the first stage 20 is removed and jumpered across, what remains is S1 directly cascaded with S2 (through A1, which is assumed to not distort the chopped signal). Since S1 and S2 toggle together, the effect is the same as S2 only, and therefore the output of the second stage is related to $(Vc)^1$ when the first stage LPF 16 is removed.

If the first stage LPF 16 cutoff is continuously variable, as represented by cutoff control 46, the output of the first stage is not proportional to $(Vc)^1$ but to $(Vc)^x$ where $0<x<1.0$ and the output of the second stage 22 is smoothly related to $(Vc)^x$, where $1.0<x<2.0$. This effect relies on the variable amount of pulse averaging provided by the LPF 16 and thus the average voltage applied to S2. The LPFs in the second and additional stages can also be varied in the same fashion for greater exponent control, such as $1.0<x<3.0$.

Figure 5:
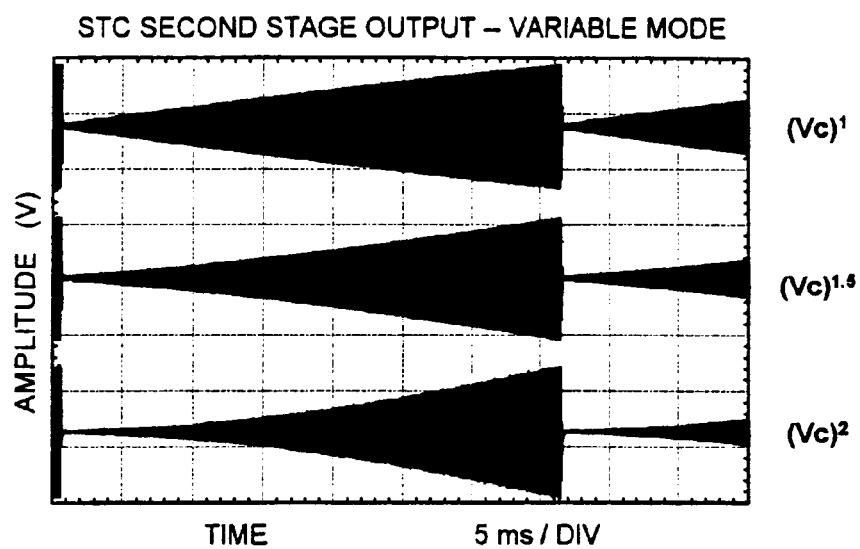
FIG. 5 compares the second stage amplifier output for three different settings of the exponent control potentiometer Rx, where the control voltage Vc is a ramp as seen in FIGS. 3 and 4.

FIG. 5 is a result of varying the LPF cutoff with the same ramped Vc seen in FIGS. 3 and 4 while observing the video output of the second stage. The upper, middle, and lower traces show the output with increasingly lower LPF cutoff frequencies, producing exponents of 1.0, ~1.5, and 2.0 respectively. As will described with respect to FIG. 2, the same effect as varying LPF 16 can be achieved by changing the gain of A1.

A detailed schematic of an illustrative embodiment 50 of the controlled gain amplifier 10 of FIG. 1 is depicted in FIG.

2 using the same reference numerals for the same elements. The video input 12 is applied to switch (S1) 14 through a highpass filter 52 to remove any DC offsets. Highpass filter 52 is formed of resistor $R_0$ (2.2K) and capacitor $C_0$ (0.01 μF) with $C_0$ connected between video input 12 and the first input to S1 and $R_0$ connected from the first input of S1 to ground. The second input of S1 is also connected to ground. Switch S1 is toggled with a duty cycle D by a variable duty cycle clock signal PWM CLOCK on the PWM GAIN CONTROL line or bus 42. S1 drives a simple LPF 16 comprised of R1 (4.7K), R2 (47K), C1 (1000 pF), C2 (100 pF). The LPF 16 output drives amplifier (A1) 18, typically an op amp type TLO74. R1 and R2 are connected in series between the S1 output and positive (+) input of A1. C1 is connected from the node between R1 and R2 to ground, and C2 is connected from the positive input of A1 to ground. The gain of A1 is set by feedback resistors $R_F$ and Rx to about 30 dB (Rx= 2.2K). $R_F$ is a fixed resistor (68K) connected in feedback from the output of A1 to the negative (−) input of A1. Rx is a variable resistor (0–200K) connected in series between $R_F$ at the node with the negative (−) input of A1 and ground. Rolloff capacitor $C_R$ (100 pF) is also connected in feedback between the output of A1 and the negative (−) input of A1, in parallel across $R_F$. As configured, the output of A1 is proportional to (Vc) VIDEO, i.e. the input video signal multiplied by a gain proportional to the first power of the control voltage.

This first stage 20 drives an identical second stage 22. The output of A1 passes through a highpass filter 54 made up of $C_0$, $R_0$ like filter 52, to switch (S2) 24 which is toggled by the clock signal on line 42. The output of S2 drives LPF 26, formed of R1, R2, C1, C2 like LPF 16 (although the resistor and capacitor values may be different in the first and second stages), which drives amplifier (A2) 28 whose gain is set by feedback resistors $R_F$ (68K) and $R_Y$. $R_F$ and $R_Y$ are connected like $R_F$ and Rx but $R_Y$ is a fixed resistor (2.2K) instead of a variable resistor like Rx. However, $R_Y$ could also be a variable resistor if the second stage 22 is to have a variable exponent gain relation like the first stage 20.

A +5 V DC reference voltage input 32 is applied to one input of switch (S3) 34, which provides a chopped 0 to +5 V waveform with duty cycle D to LPF 36 comprised of two resistors R3 (4.7K) and two capacitors C3 (0.001 μF) which are connected similarly to R1, R2, C1, C2. The second input of S3 is connected to ground. The LPF 36 output is an average voltage $V_{ave}$ that is precisely related to the duty cycle D and the +5 V reference.

A PWM control amplifier (A3) 38, and associated input resistor R4 (4.7K) and feedback capacitor C4 (0.01 μF) stabilization components, compares $V_{ave}$ with control voltage $V_c$. The output of LPF 36 is connected to the negative (−) input of A3 through R4, and C4 is connected from the output of A3 to its negative input. $V_c$ is shown as a ramped voltage (28 Hz, 0–5 V), which is a typical control waveform, and is input to the positive (+) input of A3 through gain control port 39. The output of A3 is a PWM control voltage that is applied through resistor R5 (10K) to PWM modulator 40, and varies the DC offset of a triangular waveform at the input of a first CMOS inverter 56, resulting in a variable pulse width or PWM output at a second inverter 58 in series with inverter 56. Capacitor C5 (10 pF) is connected between the input of inverter 56 and the output of inverter 58. The second inverter 58 drives the PWM GAIN CONTROL bus 42. The inverters are type 74HC04.

A 200 kHz squarewave (50% duty cycle) clock signal (CLOCK) is applied to a third inverter 60 which produces an inverted output signal. The output signal from inverter 60 is applied to a fourth inverter 62 whose output is connected to one end of resistor R6 (10K). The other end of R6 is connected to node 66 which is connected to the input of inverter 56 and also through resistor R7 (10K) to a +5 V source 68. Node 66 is also connected through capacitor C6 (470 pF) to ground.

In operation, inverters 60, 62 buffer the 200 kHz clock signal. Resistor R6 and capacitor C6 form an integrator 64 which integrates the buffered square wave clock waveform into a triangular waveform of smaller amplitude. The output of A3 through R5 controls the DC level of the triangular waveform produced by integrator 64. The outputs of A3 and integrator 64 are combined at node 66. When the amplitude of the triangular waveform reaches a sufficient voltage level, e.g. 2.5 V, to trigger inverter 56, the inverter 56, which normally has a high output, produces a high output, which causes the normally low output of inverter 58 to go high. The point in time when the output of inverter 58 goes low, determines the duty cycle D of the PWM clock pulse applied to PWM gain control bus 42, which toggles switches S1, S2, S3. Thus when the output of A3 is zero, it does not shift the DC level of the integrated clock waveform, and does not change D. However, as Vc changes, the output of A3 changes, which shifts the DC level of the integrated clock waveform, and thus the trigger point of inverters 56, 58, changing D.

The PWM GAIN CONTROL bus 42 loops back to S3 to complete the regulator loop, thereby precisely locking D to Vc, and thus precisely controlling the gain of the first and second stages. Experiments show that the switching times of S1, S, S3 track to within <1 ns for CMOS switches of type 74HC4052. This equates to <1 ns/5 μs error for a 200 kHz clock, or <0.02% error in D and thus <0.02% gain error per stage.

Figure 2:
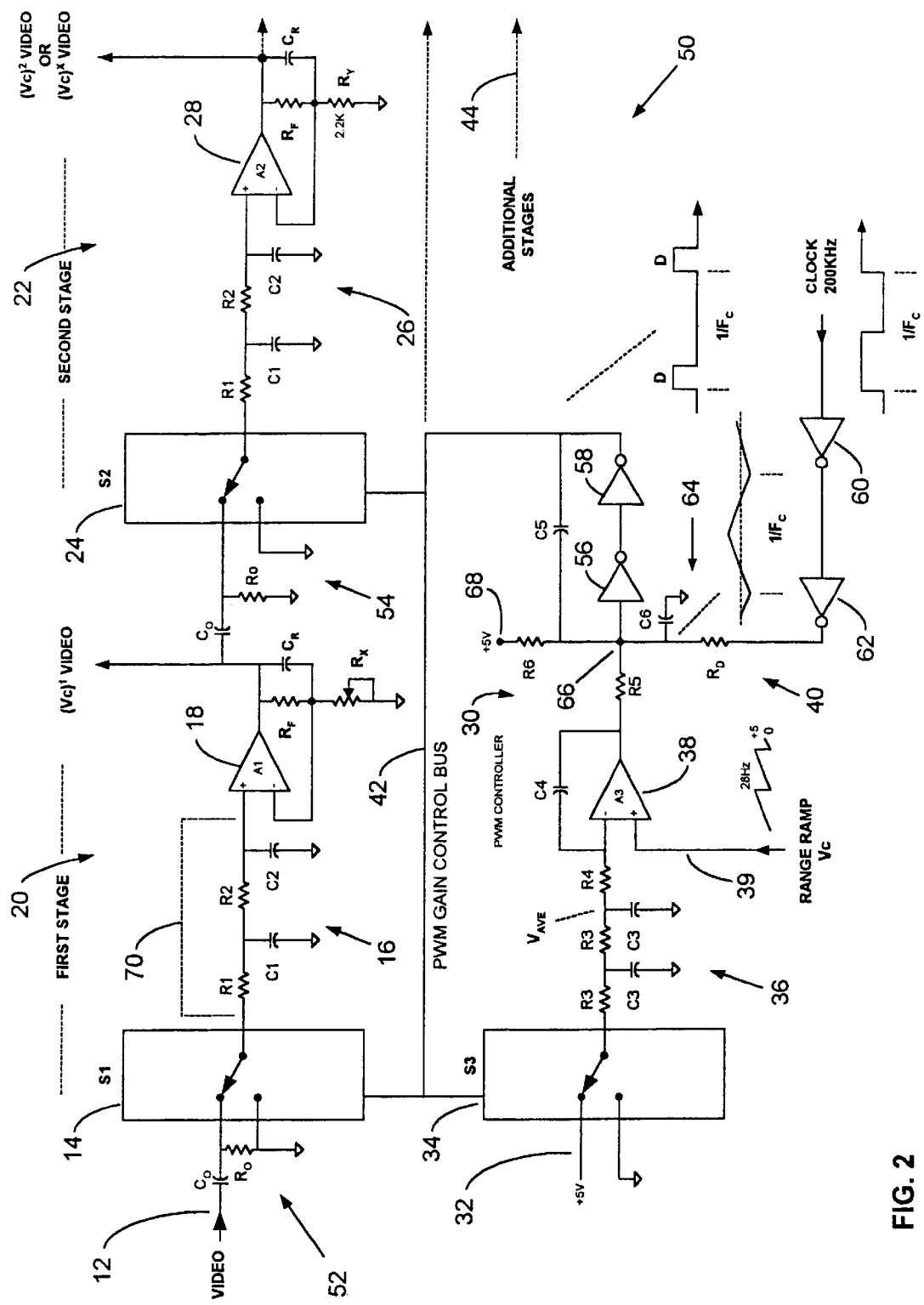
FIG. 2 is a detailed schematic of a preferred embodiment of the invention.

Variable exponent control is implemented by deleting the first stage LPF 16 (comprised of R1, R2, C1, C2) and jumpering across from S1 to A1 directly, i.e. inputting the output of S1 directly to the input of A1, as shown by dotted line 70 in FIG. 2. Variable resistor $R_x$ is used to control the gain of A1. When Rx is set to maximum at 200K, A1 gain is ~1x and A1 has a high bandwidth, fully passing the chopped waveform to S2 and thus rendering the first stage 20 ineffective in providing a variable gain function. When $R_x$ is decreased to 10 K for example, the gain of A1 is about 20x, and now the rolloff capacitor $C_R$=100 pF comes into play, causing A1 to cutoff at $1/(2\pi C_R RF)=23$ kHz. This is well below the 200 kHz clock frequency, and so considerable smoothing of the chopped pulses from S1 occurs, along with a relative amplitude reduction. Thus, first stage 20 is partially effective as a variable gain stage, and a partial exponent (<1.0) is contributed to the cascade. As an alternative to changing the gain of A1 using $R_x$, the LPF 16 cutoff can be changed by making R1 and/or R2 variable resistors, as shown in FIG. 1.

The circuit shown in FIG. 2 is a very high accuracy controlled-gain amplifier with approximately 80 dB of control range for use in high performance STC circuits. Yet the implementation is based on low cost operational amplifiers and CMOS digital circuits.

Changes and modifications in the specifically described embodiments can be carried out without departing from the scope of the invention which is intended to be limited only by the scope of the appended claims.

What is claimed is:

1. A controlled-gain amplifier comprising:
 a pulse width modulation (PWM) regulator responsive to an error signal produced by comparing a gain control voltage $V_c$ to a PWM feedback voltage $V_{ave}$ to produce a clock signal having a duty cycle determined by the applied control voltage $V_c$;

At least one switched amplifier stage, each stage being connected to the clock signal from the PWM regulator and having a gain proportional to the duty cycle of the clock signal.

2. The amplifier of claim 1 wherein each amplifier stage comprises:

a switch having an input terminal and toggled by the PWM regulator clock signal;

a lowpass filter connected to an output terminal of the switch;

a fixed gain amplifier having an input connected to the lowpass filter.

3. The amplifier of claim 2 wherein the lowpass filter has an adjustable cutoff frequency.

4. The amplifier of claim 1 wherein the gain of each amplifier stage is linearly proportional to the control voltage.

5. The amplifier of claim 1 comprising more than one amplifier stage, wherein the cascaded gain is proportional to the control voltage raised to a control exponent.

6. The amplifier of claim 2 wherein the PWM regulator comprises a PWM switch toggled by the clock signal from the PWM regulator.

7. The amplifier of claim 6 wherein each switch in the one or more amplifier stages and the PWM switch are all toggled together.

8. The amplifier of claim 6 wherein the PWM switch has an input terminal connected to a DC reference, and further comprising a PWM low pass filter connected to an output terminal of the PWM switch, a PWM control amplifier having a first input connected to the output of the PWM lowpass filter and a second input connected to the control voltage.

9. The amplifier of claim 8 further comprising a PWM modulator having an input connected to the output of the PWM control amplifier to vary the duty cycle of an input clock signal to equalize the output of the PWM lowpass filter with the control voltage.

10. The amplifier of claim 1 wherein the control voltage is a voltage ramp.

11. The amplifier of claim 1 wherein the PWM clock signal has a frequency substantially higher than the frequency of an input signal to the first amplifier stage.

12. In a sampling radar or ultrasonic rangefinder, a sensitivity-time-control (STC) circuit comprising an amplifier of claim 1.

13. A controlled-gain amplifier comprising:

a pulse width modulation (PWM) regulator having a variable duty cycle clock output the PWM regulator being responsive to an error signal produced by comparing a gain control voltage Vc to a PWM feedback voltage Vave to produce the variable duty cycle clock output;

a first switch toggled in proportion to the variable duty cycle clock output of the PWM regulator and having one terminal connected to a signal input, a first lowpass filter having first and second terminals with the first terminal connected to a second terminal of the first switch, a first fixed-gain amplifier having an input connected to the second terminal of the first lowpass filter.

14. The amplifier of claim 13 further including a second switch, second lowpass filter and second fixed-gain amplifier cascaded with the first switch, first lowpass filter, and first fixed-gain amplifier.

15. The amplifier of claim 14 where at least one of the lowpass filters has a continuously adjustable cutoff to vary a control exponent.

16. The amplifier of claim 13 where the first switch has a third terminal connected to ground such that the second terminal of the switch switches between the first and third terminals at the clock frequency and in proportion to the clock duty cycle.

17. A method of amplifying an input signal with a controlled gain comprising:

generating a variable duty cycle clock signal with a duty cycle determined by a control voltage by comparing the control voltage to a feedback voltage;

chopping the input signal in proportion to the duty cycle of the clock signal;

averaging the chopped signal to produce an attenuated version of the input signal;

amplifying the attenuated version of the input signal to produce an amplified signal having a gain proportional to the control voltage.

18. The method of claim 17 further comprising performing the steps of chopping, averaging, and amplifying in successive cascaded stages to produce an output signal having a gain proportional to the control voltage raised to a control exponent.

19. The method of claim 17 wherein the step of averaging the chopped signal is performed by passing the chopped signal through a lowpass filter, and further comprising adjusting the cutoff frequency of the lowpass filter to produce a gain proportional to the control voltage raised to a non-integer exponent.

* * * * *